United States Patent [19]

Liu et al.

[11] Patent Number: 5,257,095
[45] Date of Patent: Oct. 26, 1993

[54] COMMON GEOMETRY HIGH VOLTAGE TOLERANT LONG CHANNEL AND HIGH SPEED SHORT CHANNEL FIELD EFFECT TRANSISTORS

[75] Inventors: Yow-Juang (Bill) Liu, San Jose; Salvatore Cagnina, Los Altos, both of Calif.

[73] Assignee: Advanced Micro Devices, Inc., Sunnyvale, Calif.

[21] Appl. No.: 511,853

[22] Filed: Apr. 19, 1990

Related U.S. Application Data

[63] Continuation of Ser. No. 370,088, Jun. 21, 1989, abandoned, which is a continuation of Ser. No. 120,719, Nov. 5, 1987, abandoned, which is a continuation of Ser. No. 805,162, Dec. 4, 1985, abandoned.

[51] Int. Cl.$^5$ ............... H01L 29/10; H01L 29/78; H01L 29/68
[52] U.S. Cl. .................. 257/315; 257/327; 257/368; 257/408; 257/344; 257/346
[58] Field of Search ............... 357/23.4, 23.5, 41, 357/23.1, 23.3, 23.8, 23.9, 23.12, 90, 91

[56] References Cited

U.S. PATENT DOCUMENTS

| | | | |
|---|---|---|---|
| 3,821,781 | 1/1974 | Chang et al. | 357/42 |
| 4,072,545 | 2/1978 | De La Moneda | 357/23.9 |
| 4,119,995 | 10/1978 | Simko | 357/23.9 |
| 4,142,197 | 2/1979 | Dingwall | 357/23.9 |
| 4,282,648 | 9/1981 | Yu et al. | 357/42 |
| 4,423,433 | 12/1983 | Sasahi et al. | 357/41 |
| 4,445,267 | 8/1984 | De La Moneda et al. | 357/23.3 |
| 4,471,373 | 9/1984 | Shimizu et al. | 357/23.5 |
| 4,509,067 | 7/1985 | Minami et al. | 357/51 |
| 4,514,747 | 7/1985 | Niyata et al. | 357/90 |
| 4,536,944 | 8/1985 | Bracco et al. | 357/23.12 |
| 4,573,144 | 2/1986 | Countryman, Jr. | 357/23.5 |
| 4,577,391 | 3/1986 | Hsia et al. | 357/23.9 |
| 4,590,663 | 5/1986 | Haken | 357/50 |
| 4,590,665 | 5/1986 | Owens et al. | 357/23.5 |
| 4,656,492 | 7/1987 | Sunami et al. | 357/90 |
| 4,663,645 | 5/1987 | Komori et al. | 357/23.3 |

FOREIGN PATENT DOCUMENTS

| | | | |
|---|---|---|---|
| 58-197776 | 11/1983 | Japan | 357/23.5 |
| 60-207383 | 10/1985 | Japan | 357/23.1 |
| 2081012 | 2/1982 | United Kingdom | 357/23.5 |

OTHER PUBLICATIONS

S. Ogura et al "Design and Characteristics of the Lightly Doped Drain-Source (LDD) Insulated-Gate Field-Effect Transistor," *IEEE Journal of Solid-State Circuits*, vol. SC-15 (1980) pp. 424-432.
A. G. Fortino et al, "Method of Making a Submicron Field-Effect Transistor", IBM Technical Disclosure Bulletin, vol. 23 (1980) pp. 534-536.
S. M. Sze, *Semiconductor Devices, Physics and Technology*, John Wiley & Sons, New York (1985) pp. 392-395.

*Primary Examiner*—J. Carroll
*Attorney, Agent, or Firm*—Fliesler, Dubb, Meyer & Lovejoy

[57] ABSTRACT

A field effect device transistor geometry and method of fabrication are described. The FET may be operated from a bias potential that forms an electrical field within the device exceeding a predetermined field strength. The device comprises a semiconductor substrate portion of a first conductivity type, said substrate portion having a major surface, and a region of a second conductivity type adjacent the major surface and adapted to receive the predetermined bias potential, the region including a subregion of like conductivity type and lesser conductivity, the subregion being positioned within the region such that the subregion receives at least that portion of the dipole electrical field including and exceeding the predetermined value.

17 Claims, 3 Drawing Sheets

FIG. 1
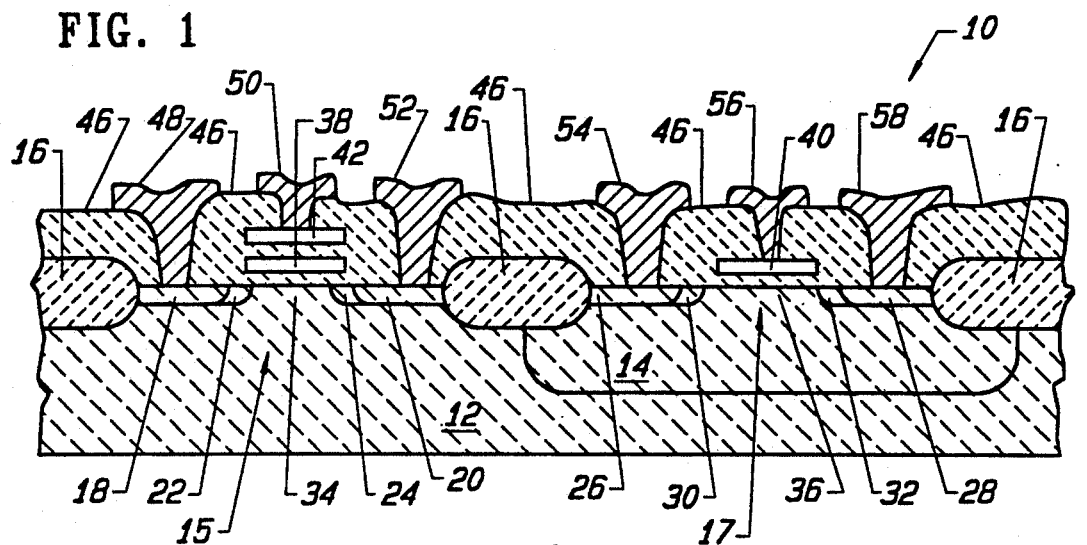
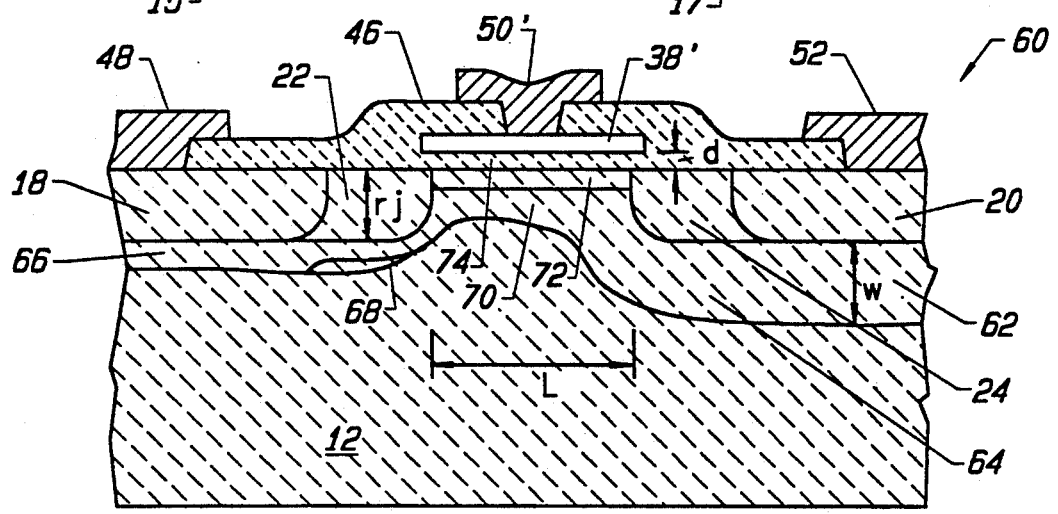
FIG. 2
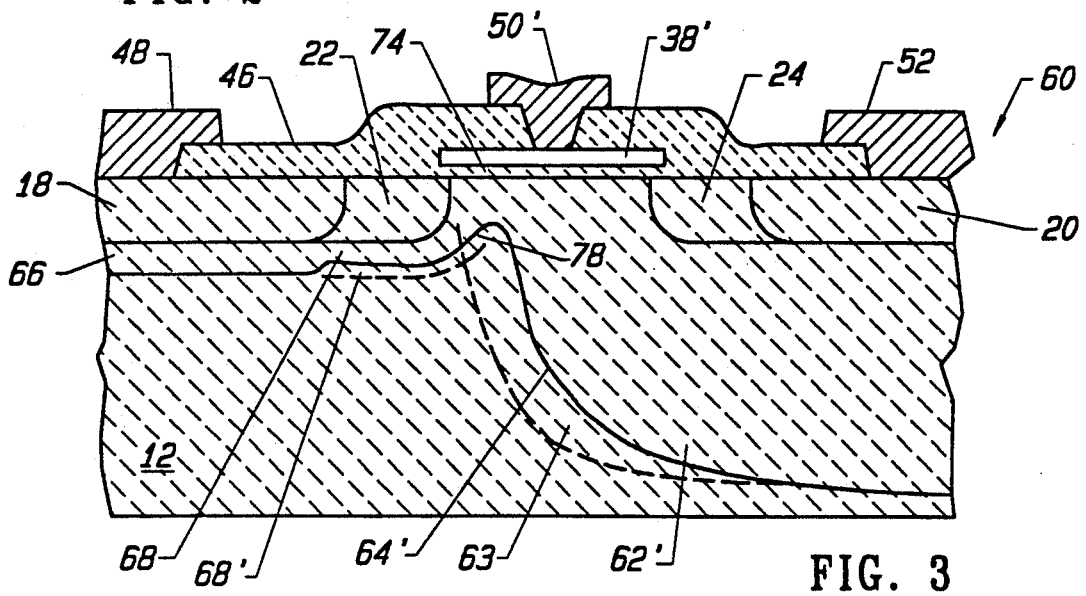
FIG. 3

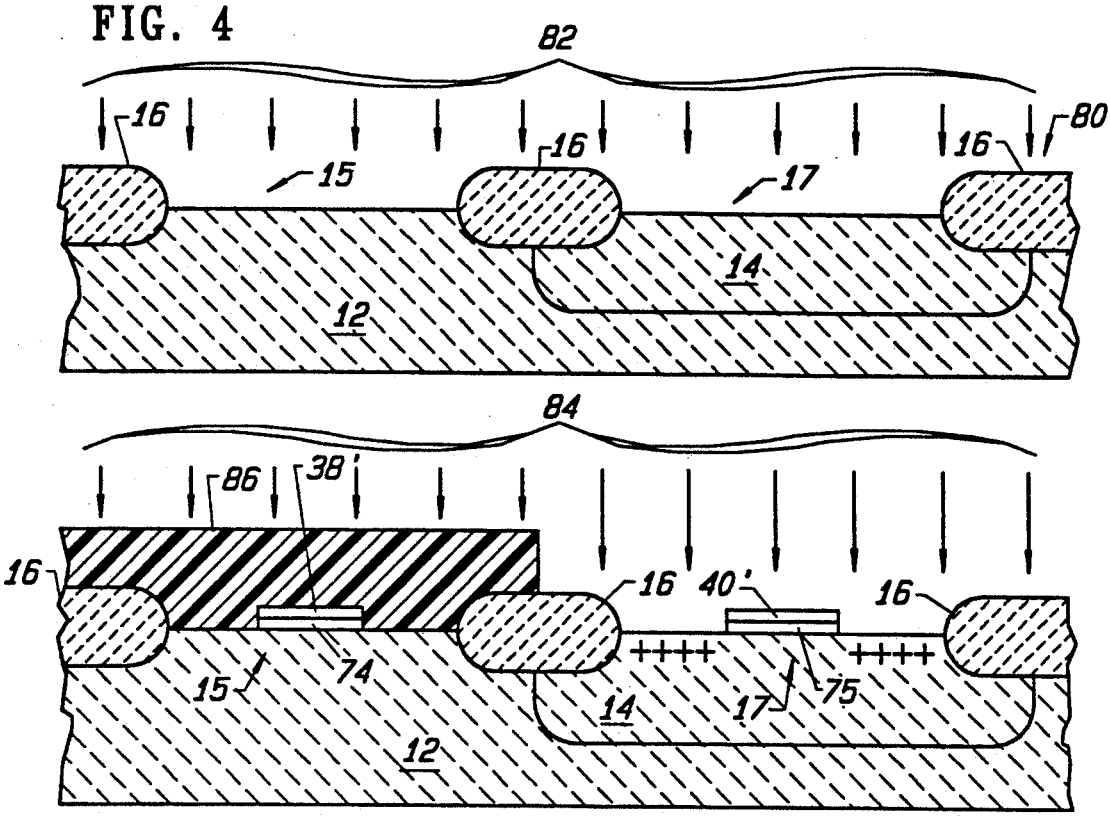
FIG. 4
FIG. 5
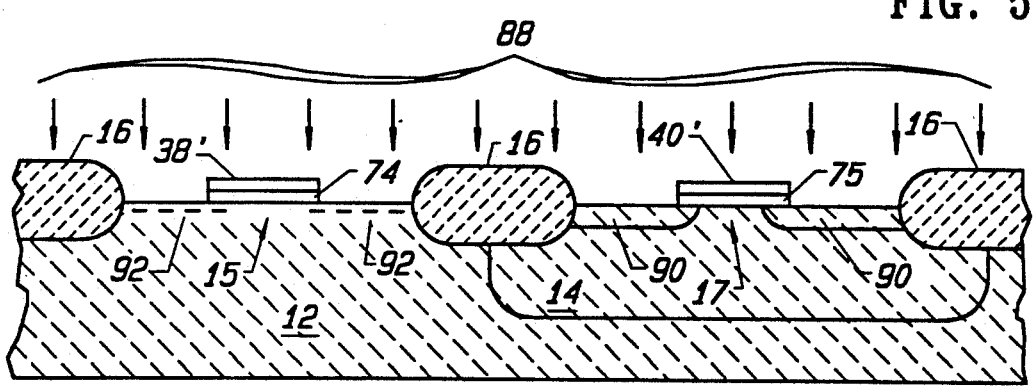
FIG. 6
FIG. 7
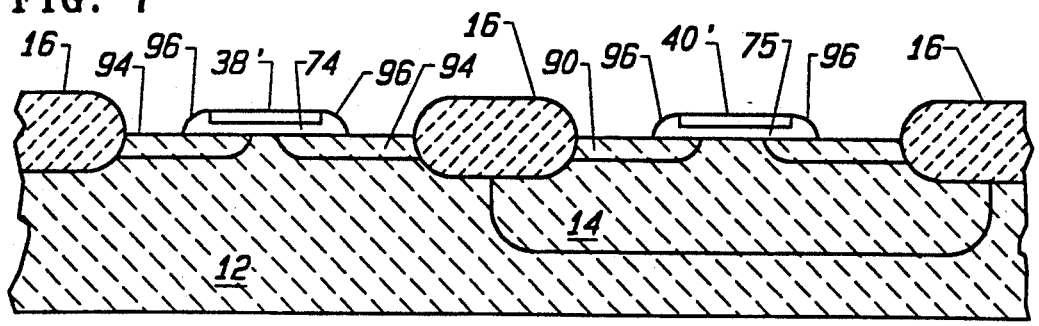

COMMON GEOMETRY HIGH VOLTAGE TOLERANT LONG CHANNEL AND HIGH SPEED SHORT CHANNEL FIELD EFFECT TRANSISTORS

This application is a continuation of Ser. No. 07/370,088, filed Jun. 21, 1989, now abandoned; which is a continuation of Ser. No. 07/120,719, filed Nov. 5, 1987, now abandoned; which is a continuation of Ser. No. 06/805,162, filed Dec. 4, 1985, now abandoned.

FIELD OF THE INVENTION

The present invention generally relates to field effect transistor (FET) structures and to optimize methods of fabricating both N-and P-channel type FET devices. More specifically, the present invention relates to a transistor geometry that permits operation from relatively large drain to source potential differences in a long channel configuration and at very high speeds in a short channel configuration, both without operational lifetime degradation and, additionally, to the optimized processes of fabricating n-type, p-type and complementary common long and short channel geometry FET transistors in a common monolithic substrate.

BACKGROUND OF THE INVENTION

In pursuit of improving semiconductor digital logic devices, there is a continual quest to define and produce transistors having ever smaller overall cell geometries and that are capable of operating at ever increasing switching speeds. Cell geometry is here defined as the two-dimensional surface area required for the implementation of a single, integral, active logic element, typically a single N- or P-channel transistor or a pair of complementary transistors. Cell geometry is distinguished from transistor geometry in that the latter refers to the three-dimensional structure of a single, integral active logic element.

Reduced cell geometry is naturally desired to increase cell packing density that, in turn, permits ever increased levels of device integration and corresponding logic system complexity and capability. Increases in operating speed are naturally advantageous regardless of the level of integration realized. Conveniently, these desires are complementary in that a major factor in the operating speed of a field effect transistor is the channel length defined by its transistor geometry. Reduction of channel length results in a corresponding reduction in the time required for charge carriers to transit between the transistor source and drain regions and, to at least a first approximation, the switching speed of the transistor.

There are, however, numerous other complications involved in obtaining high switching speed, small cell geometry transistors. These complications include excessive power dissipation and the onset of short channel effects. Power dissipation is naturally a problem as the sheer number of transistors packed together on a common monolithic substrate increases. Practical construction constraints limit the rate at which power dissipated as heat can be removed from the vicinity of the transistors. A typical manner of dealing with this problem involves reducing the operating potential difference applied to the transistors so as to effect a corresponding decrease in the power dissipated. There is, however, a practical limit to the reduction of the operating potential difference before there is a corresponding degradation of the transistor's operating characteristics, particularly including its switching speed. Again conveniently, this practical limit also tends to decrease as the cell dimensions are reduced.

Short channel effects encountered typically include decreased operating device breakdown voltages, hot carrier effects, punch-through shorting of the transistor and other effects of lesser significance. These short channel effects are generally related to the channel length of the transistor and the electric field strength induced between the source, drain and gate as a result of the applied operating potential difference. Where the electric field is of sufficient strength at the drain/substrate interface, avalanche breakdown will occur leading to the sudden destruction of the transistor. Similarly, if the depletion regions generally associated with the source and drain regions, as induced by the application of the operating potential difference, extend sufficiently toward one another to overlap, then a current punch-through condition will occur wherein the source and drain are effectively shorted together. Again, generally there will be sudden catastrophic destruction of the transistor.

A much less sudden, though equally deleterious short channel effect occurs as the result of the generation of hot carriers near the gate oxide/semiconductor substrate interface. Hot carriers are charge carriers that have been energized by the applied electric field sufficiently to overcome the potential barrier at the oxide/substrate interface. Consequently, the charge carriers are injected directly into the gate oxide where they thereafter remain trapped. As such, the gate operating characteristics of the transistor are progressively degraded from their intended nominal values over the operating lifetime of the transistor.

The short channel effects are also typically handled by reducing the applied operating potential difference so as to reduce the strength of the electrical field established in the transistor. Additionally, the punch-through effect is specifically addressed by generally increasing the doping density within the channel region. This results in an increase in the operating potential difference required to establish overlapping source and drain depletion regions.

The hot carrier effect may be further specifically addressed by providing a very shallow, lightly doped drain (LDD) region at the gate oxide/substrate interface closest to the point within the transistor where the greatest electric field strength occurs. Devices constructed with LDD regions are shown in U.S. Pat. Nos. 4,282,648 and 4,366,613. The provision of such a lightly doped region effectively reduces the electrical field strength adjacent the oxide/substrate interface. Typically, the lightly doped drain region is extremely shallow so as to minimally impact all other electrical characteristics of the drain to channel interface and very lightly doped so as to maximize the corresponding reduction of the electrical field strength within the lightly doped drain region. This reduction in field strength directly reduces the transfer of energy to charge carriers at the oxide/substrate interface with a corresponding reduction in the number of charge carriers injected into the gate oxide. The generation of any hot carriers deeper in the substrate is generally of no concern as they remain in the channel while moving between the source and drain regions. Indeed, it is typically preferred that some hot carriers be generated within the substrate as a tolerable consequence to utilizing an electrical field strength sufficient to move charge carriers between the source and drain regions at an optimally maximum velocity.

In certain applications, reduction of the operating potential difference is not an acceptable solution to dealing with the problems generally described above. Rather, provision must be made for at least some of the transistors present on the common substrate to operate from substantially increased potential differences. Exemplary of these applications are programmable memory devices such as electrically programmable read only memories (EPROM) and floating gate electrically erasable programmable read only memories (EEPROM). In these applications there is a positive desire to greatly increase the packing density of the transistors utilized as memory cells. At the same time, however, there is a positive requirement that a high voltage be tolerated by the transistors as is required whenever their corresponding memory cells are programmed and, where applicable, electrically erased. Typically, current EPROM devices require a programming voltage of between 10 and 20 volts to effect programming. EEPROM devices require programming and erasure voltages typically of between 15 to 25 volts.

Since small cell geometry, high speed transistors are preferably operated at voltages substantially less than 5 volts, typically on the order of 2-4 volts, they cannot be used. Instead, transistors having significantly different deep junction transistor and large cell geometries are typically utilized so that, with their longer channel lengths, the high programming and erasure voltages can be better tolerated. This, however, typically precludes or substantially complicates the use of high speed optimized transistor geometry transistors on the same monolithic memory chip. Thus, the high voltage tolerance is gained at the substantial expense of the total device memory capacity and a substantial reduction in circuit performance. This result is not as desirable as if substantially smaller cell geometry, high speed transistors could be used monolithically with large cell geometry transistors where specifically required for high voltage tolerance.

SUMMARY OF THE INVENTION

A purpose of the present invention is therefore to provide a transistor geometry of variable channel lengths that is capable of general usage and that overcomes the above noted problems associated with the prior art.

This is accomplished in the present invention by providing a field effect device that may be subjected to a predetermined bias potential that forms an electrical field within the device exceeding a predetermined field strength, the device comprising a semiconductor substrate portion of a first conductivity type, the substrate portion having a major surface, and a region of a second conductivity type adjacent the major surface and adapted to receive the predetermined bias potential, the region including a subregion of like conductivity type and lesser conductivity, the subregion being positioned within the region such that the subregion receives at least that portion of the electrical field exceeding the predetermined value.

The present invention also provides a method of fabricating a field effect device at a surface of a semiconductor substrate, the method comprising the steps of forming a gate mask over a surface portion of the substrate, the corresponding portion of the substrate being of a first conductivity type, providing a first dopant of a second conductivity type to form first and second semiconductor regions within the substrate and respectively extending below the surface thereof for a predetermined depth, the first and second semiconductor regions being spaced apart from one another and aligned with respect to the edges of the gate mask, forming a border mask bordering and extending beyond the edges of the gate mask, so as to overlie respective portions of the first and second semiconductor regions, and providing a second dopant of the second conductivity type to form third and fourth semiconductor regions within the substrate coextensive with respective portions of the first and second semiconductor regions, the third and fourth semiconductor regions being spaced apart from one another and aligned with respective edges of the border mask and respectively extending below the surface of the substrate to about the predetermined depth.

Thus, an advantage of the present invention is that it provides a common transistor geometry for the further realization of both high speed, small cell and high voltage tolerant long channel field effect transistors fabricated in a common monolithic substrate.

Another advantage of the present invention is that it provides a widely variable transistor geometry field effect transistor, all embodiments of which can be simultaneously fabricated on a common monolithic substrate with only very minimal additional processing required.

A further advantage of the present invention is that it effects a substantial increase in the gated diode breakdown voltage that can be sustained in the nominal operation of long channel configuration field effect transistors.

Yet another advantage of the present invention is that it also substantially increases the operating potential difference than can be nominally sustained without the occurrence of punch-through in both long and short channel field effect transistors.

A still further advantage of the present invention is that it substantially reduces, if not eliminates, the injection of hot carriers into the gate oxide even when operated from high operating potential differences.

Yet still another advantage of the present invention is that it is readily adaptable to fabrication procedures to realize n-type field effect transistors and, further, to the realization of both n- and p-type transistors on a common monolithic substrate utilizing an optimized fabrication procedure featuring a minimization of required masking steps.

A yet still further advantage of the present invention is that it provides for the reliable fabrication of an enhanced field effect transistor structure that may be readily adapted to all logic field effect transistor applications and, in particular, to memory cell applications requiring operation from and tolerance of high operating voltages.

BRIEF DESCRIPTION OF THE DRAWINGS

These and other attendant advantages of the present invention will become apparent and readily appreciated as the same becomes better understood by reference to the following detailed description of the invention when considered in connection with the accompanying drawings, wherein like reference numerals designate like parts throughout the figures, and wherein:

FIG. 1 provides a cross-sectional view of an EEPROM memory cell constructed in accordance with the present invention;

FIG. 2 provides a cross-sectional view of a transistor constructed in accordance with the present invention for illustrating the low voltage operation thereof;

FIG. 3 provides a cross-sectional view of the transistor of FIG. 2 illustrating the high voltage operation thereof;

FIGS. 4-9 provide cross-sectional views of preferred complementary metal oxide semiconductor transistor cells illustrating the successive steps in a preferred mode of their fabrication.

DETAILED DESCRIPTION OF THE INVENTION

Figure 8:
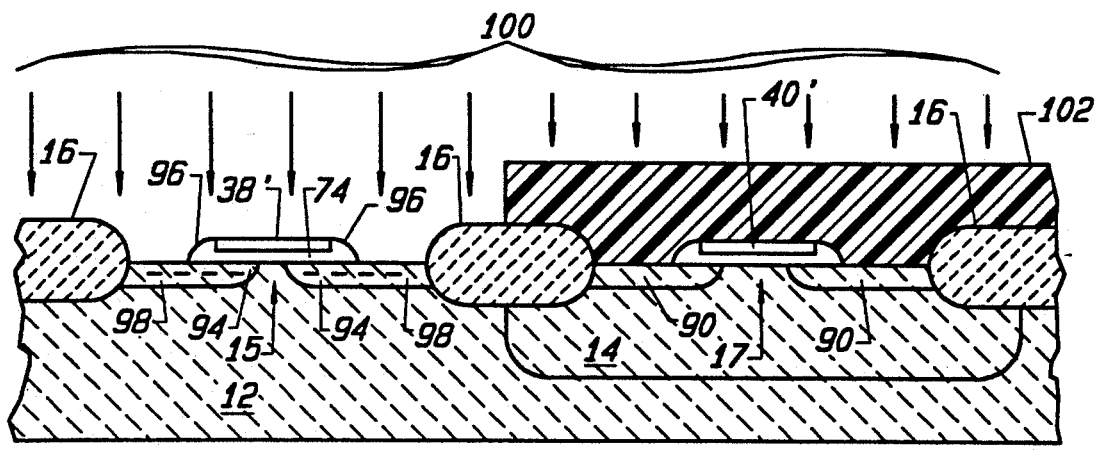

The pertinent aspects of the transistor geometry characteristic of the present invention are exemplified in an EEPROM device, with an associated complementary channel type FET device, both generally indicated by the reference numeral 10, as shown in FIG. 1. Accordingly, a preferred embodiment of the present invention is a EEPROM memory cell. For purposes of clarity, an EEPROM gate contact structure is only generally shown in FIG. 1. The present invention, however, is not to be construed narrowly as being limited only for use in EEPROM devices. The present invention is capable of much wider application. In particular, the present invention is suitable for use in all applications wherein the use of a small cell geometry, high switching speed and high operating voltage tolerant transistors are desirable.

Considering now the exemplary EEPROM transistor geometry 10 of FIG. 1, a substrate 12, preferably of silicon, having a nominal body doping density of approximately $8 \times 10^{14}$ cm$^{-3}$ of a p-type impurity such as boron is shown. A well region 14 is provided within the substrate 12 and adjacent a portion of the surface thereof. The well region 14 is preferably doped n-type by the provision of an impurity such as phosphorus to a doping density of approximately $8 \times 10^{15}$ cm$^{-3}$. Field oxide portions 16 are preferably provided at the perimeter of the well region 14 and other surface portion areas so as to define surface area regions 15, 17 for the discrete fabrication of respective N- and P-channel transistors.

Highly doped n-type source and drain regions 18, 20 are provided at the semiconductor surface within a N-channel transistor areas. The doping level of the source and drain regions is preferably above $1 \times 10^{20}$ cm$^{-3}$ utilizing, for example, an arsenic impurity. Source and drain extension regions 22, 24, preferably doped with a phosphorus impurity, to a level of about $5 \times 10^{17}$ cm$^{-3}$, are respectively provided so as to electrically extend the source and drain regions 18, 20 toward one another and define a channel region 34 having a length of about 0.75 to 3.0 micrometers. EEPROM gate electrodes 38, 42 are provided in a layer of oxide 46 so as to overlay the channel region 34. Consistent with EEPROM gate structures, a gate contact 50 is provided to the uppermost gate electrode 42 while leaving the lower gate electrode 38 essentially electrically isolated within the oxide 46. The N-channel EEPROM transistor is substantially completed with the provision of source and drain contacts 48, 52 to the source and drain regions 18, 20, respectively.

Similarly, for the P-channel transistor highly doped p-type source and drain regions 26, 28 are provided in the N-well 14 at the surface area 17 of the semiconductor substrate 12. The source and drain regions 26, 28 are preferably provided at a doping density of $5 \times 10^{19}$ cm$^{-3}$, primarily through the implantation of BF$_2$ impurities. Source and drain extension regions 30, 32 are respectively provided adjacent the source and drain regions 26, 28 and positioned so as to define the channel 36 with a channel length of about 0.75 to 3.0 micrometers. These extension regions 30, 32 are preferably provided with a doping density of $1 \times 10^{18}$ cm$^{-3}$ utilizing a boron impurity.

The MOSFET gate structure for a P-channel transistor is completed with the provision of the isolated and control gate 40 suspended in the oxide layer 46 so as to overlay the channel region 36. Finally, the source 54, gate 56, and drain contact 58 provide conduction paths to the source region 26, control gate 40, and drain region 28.

Referring now to FIG. 2, an operating state of a transistor constructed in accordance with the present invention is illustrated. The gate structure shown is simplified to that of a conventional FET device so as not to obscure the pertinent aspects of the present invention. Further, only the operation of an N-channel device 60 will be described as the operation of a P-channel device is directly analogous. Considering FIG. 2 in greater detail, the preferred transistor geometry employs source and drain extension regions 22, 24 having junction depths $r_j$ that closely match the junction depths of the source and drain regions 18, 20. With the application of an operating potential difference between the source and drain contacts 48, 52, referenced positive with respect to the drain 20, and by the application as a small positive voltage potential to the gate contact 50′, and therefore to the gate electrode 38′, source, source extension, channel, drain extension and drain depletion regions 66, 68, 70, 64 and 62 are formed. Excepting that the source and drain extension regions 22, 24 of the present invention have a doping density significantly less than that of the source and drain regions 18, 20, the dimensions of the FET device 60, when selected for high speed operation, are preferably such that it would conventionally be classified as a short-channel device and, alternately, when selected for high voltage operation, as a long channel device. The conventionally accepted, though empirical, short channel transistor definition establishes a dividing line based on the minimum channel length L for which long channel operating characteristics can be still observed. In the present invention, the channel length L is measured between the closest respectively approaching edges of the source and drain extension regions 22, 24. The minimum channel length $L_{min}$ for a desired transistor geometry that exhibits long channel characteristics may be determined from empirical equation 1:

$$L_{min}=0.4\,[r_j d(W_s+W_d)^2]^{\frac{1}{4}}, \qquad \text{Eq. 1}$$

where $r_j$ is the junction depth of the source and drain regions 18, 20 in micrometers, d is the thickness of the gate oxide 74 in angstroms, $W_s$ is the depletion region width 66 associated with the source region 18 and $W_d$ is the depletion region width 62 associated with the drain region 20, both in micrometers. Sze, *Physics of Semicon-*

*ductors*, (1981) at pg.77. The depletion region widths $W_s$ and $W_d$ are readily determined from equations 2 and 3:

$$W_d = \sqrt{\frac{2\epsilon_s}{qN_A}(V_{bi} + V_{BS})} \text{ , for } N_D \gg N_A \quad \text{Eq. 2}$$

$$W_s = \sqrt{\frac{2\epsilon_s}{qN_A}(V_D + V_{bi} + V_{BS})} \text{ , for } N_D \gg N_A \quad \text{Eq. 3}$$

where $V_{bi}$ is the built-in voltage of the junction, $V_{BS}$ is the substrate bias, $\epsilon_x$ is the semiconductor substrate permutivity and $N_A$ is the impurity density of the substrate 12.

In accordance with the present invention, the doping densities of the source and drain extension regions 22, 24 are preferably reduced by one to three orders of magnitude with respect to the source and drain regions 18, 20. As is illustrated in FIG. 2, the depletion regions 68, 64 associated with the source and drain extension regions 22, 24 are therefore somewhat decreased with respect to the depletion region 66, 62. The doping density within the extension regions 22, 24 may be sufficiently reduced such that the abrupt junction assumption for calculating depletion widths may be no longer accurate. Accordingly, the widths of the depletion regions 68, 64 may be correctly calculated using equations 4 and 5:

$$W_s = \sqrt{\frac{2\epsilon_s}{q}\left(\frac{N_A + N_D}{N_A N_D}\right)(V_{bi} + V_{BS})} \quad \text{Eq. 4}$$

$$W_d = \sqrt{\frac{2\epsilon_s}{q}\left(\frac{N_A + N_D}{N_A N_D}\right)(V_{bi} + V_{BS} + V_D)} \quad \text{Eq. 5}$$

where $N_D$ is the donor impurity concentration of the source and drain extension regions 22, 24.

An immediate, though slight, benefit evidenced by the present invention is that the effective channel length $L_{eff}$ of the FET device 60, in short channel embodiments, varies to a slight but distinctly lesser degree with changes in the operating potential difference as compared to conventional short channel devices, particularly in the presence of a relatively high short channel operating potential. In conventional FET devices, the effective channel length is defined as:

$$L_{eff} = L - y_s - y_d \quad \text{Eq. 6}$$

where L is the fabricated channel length, $y_s$ is the horizontal depletion region width associated with the source and $y_d$ is the horizontal depletion region width associated with the drain. The horizontal depletion widths are given by:

$$y_s = \sqrt{\frac{2\epsilon_s}{q}\left(\frac{N_A + N_D}{N_A N_D}\right)(V_{bi} - \Psi_s + V_{BS})} \quad \text{Eq. 7}$$

-continued $$y_d = \sqrt{\frac{2\epsilon_s}{q}\left(\frac{N_A + N_D}{N_A N_D}\right)(V_{bi} + \Psi_s + V_{BS} + V_D)} \quad \text{Eq. 8}$$

where $\Omega_s$ is the channel substrate surface potential. As can be seen by comparison of equations 4–5 and 7–8, the horizontal depletion regions $y_s$, $y_d$ are slightly less than the depletion regions widths $W_s$ and $W_d$ and, accordingly, will vary slightly less for equivalent changes in operating potential.

Depending on the voltage potential applied to the gate contact 50', a channel region 72 may be induced, permitting controlled conduction between the source and drain regions 18, 20 via the source and drain extension regions 22, 24. Any added channel resistance incurred as a result of the channel extension regions, 22, 24 may be reduced by increasing the doping density of the extension regions 22, 24 and by reducing their width in line with the channel 72 between the source and drain regions 18, 20. Alternately, the source extension region 22 can be completely omitted to further reduce channel resistance.

Operation of the FET device 60 at high operating potential differences, relative to respective short and long channel embodiments of the present invention, is illustrated in FIG. 3. Excepting again that the source and drain extension regions 22, 24 of the present invention are of a lesser doping density with respect to the source and drain regions 18, 20, the increased operating potential difference results in a substantially increased depletion region width. Above a critical operating potential difference, a conventional drain depletion region 63 would overlap in an area 78 with a depletion region 68' associated with a conventional source region. This circumstance is known as punch-through and is defined as occurring when the effective channel length $L_{eff}$ is reduced to zero. The critical punch-through voltage for a particular transistor geometry $V_{Dpt}$ can be determined from equations 6, 7 and 8 for a given channel length L.

In accordance with the present invention, the source and drain extension regions 22, 24 are not of the same doping density as the source and drain regions 18, 20. Instead, they are of significantly lesser doping density (again, preferably, one to three orders of magnitude less) and, by virtue of their respective placement relative to the source and drain regions 18 and 20 so as to exclusively define the channel region 34, their doping density directly influences the horizontal extent of the source and drain depletion regions $y_s$, $y_d$. As can be seen from equations 7 and 8, reduction in the donor impurity doping density directly reduces both $y_s$ and $y_d$. Reduction of the doping density, particularly that of the drain extension region 24, results in the slightly reduced width of depletion region 64' as shown in FIG. 3. Similarly, there is as reduction in the depletion region width of the depletion region 68 associated with the source extension region 22, though to an even relatively lesser degree.

For long channel embodiments of the present invention, the reduction in horizontal depletion region widths is generally negligible relative to the length of the channel. Thus the punch-through potential difference limit is established by the doping density established by a deep channel implant for any particular channel length. This implant density is, in turn, limited by a phenomenon conventionally known as body effect. This phenomenon is dependent on both the doping density and volume of the channel region. The consequence of body effect is an increase in the time required to clear the channel region of charge carriers, either by recombination or drift into the substrate bulk. Thus, for channel lengths of 1.5 to 3.0 micrometers, an upper limit of approximately $1 \times 10^{15}$ cm$^{-3}$ in the channel region is preferred.

Short channel embodiments of the present invention benefit greatly from a reduced sensitivity to body effect. The lower volume of the channel region allows a corresponding increase in the channel doping density. Thus, for channel lengths of about 0.75 to 1.5 micrometers, an upper limit of $1 \times 10^{16}$ cm$^{-3}$ in the channel region is preferred. Additionally, the effect of the presence of the source and drain extension regions is proportionally greater than to that in long channel embodiments, though still slight with respect to the effect of the increased allowable channel doping density.

Operation at high operating potential differences, however, requires more than precluding the occurrence of punch-through. High voltage operation also requires that the FET device 60 be tolerant of the maximum operating voltage corresponding electric fields created within the device 60. The drain substrate junction of convention FET devices is the most sensitive to electric field strength. The critical junction breakdown voltage $V_{bd}$, corresponding to the maximum electric field strength that maybe tolerably induced by the applied operating potential voltage, is given by equation 9:

$$V_{bd} = \frac{\epsilon_s \xi_m^2}{2q} \left( \frac{1}{N_A} + \frac{1}{N_D} \right) \qquad \text{Eq. 9}$$

where $V_{bd}$ is equal to the drain voltage potential relative to the gate and source voltage potentials.

In accordance with the present invention, it is recognized that the peak electric field strength is substantially localized to that portion of the drain/substrate junction closest to the gate, particularly when the gate is maintained at the source voltage potential, i.e., gated diode configuration. By virtue of the drain extension region 24, as provided by the present invention, a significant reduction in the maximum electric field $\xi_m$ is obtained within the drain extension region near the extension/substrate junction closest to the gate electrode 38'. Calculation of the electric field strength induced by the juxtaposition of the drain extension region 24 and the gate electrode 38' is largely empirical. However, the increase in breakdown voltage obtainable through the present invention may be directly extrapolated from the performance characteristics of conventional, well characterized FET devices, by specifically taking into account the reduced doping density of the drain extension region 24.

Consequently, both long and short channel embodiment of the FET device 60, in accordance with the present invention, can be operated from distinctly greater respective potential differences than generally corresponding conventional FET devices before reaching the onset limit of the punch-through or gated diode breakdown conditions. This is accomplished while retaining, in short channel embodiments, the high speed capabilities and substantially the same ease of fabrication of conventional short channel transistors and, further, while allowing the simultaneous fabrication of essentially identical transistor geometry, high voltage tolerant long channel devices on the same monolithic substrate.

Considering now FIG. 4, there is shown the initial stage of the fabrication of a preferred, complementary FET transistor geometry. The initial substrate structure 80 preferably is composed of the substrate 12 having a background doping density generally in the range of $1 \times 10^{14}$ cm$^{-3}$ to $5 \times 10^{15}$ cm$^{-3}$ and preferably in the range of $5 \times 10^{14}$ cm$^{-3}$ to $1 \times 10^{15}$ cm$^{-3}$ by the presence of p-type impurities such as boron. An N-well 14 is preferably provided at a surface of the substrate 12 by conventional fabrication procedures. The doping density of the N-well 14 is generally in the range of $1 \times 10^{15}$ cm$^{-3}$ to $1 \times 10^{17}$ cm$^{-3}$ and preferably in the range of $5 \times 10^{15}$ cm$^{-3}$ to $1 \times 10^{16}$ cm$^{-3}$ by the provision of n-type impurities, such as phosphorus. An N-channel transistor area 15 and P-channel transistor area 17 are delimited by portions of a field oxide 16 fabricated utilizing a conventional nitride mask, local silicon oxidation procedure and then left exposed by the stripping of the nitride masks.

Two ion implantations, preferably of p-type impurities, are then performed to provide the punch-through doping and to adjust the threshold voltages of both the N and P-channel transistors. The first implant is preferably the punch-through implant. It is generally performed at an implant energy ranging from 50 to 150 KeV, and preferably at about 110 KeV, utilizing boron impurity ions. The energy of the implant is selected so as to generally match the junction depth of the source and drain regions that are to be fabricated. The dosage of the implant is selected to optimize the resistance to punch-through conditions for high speed, short channel or high voltage, long channel operation of the eventual N-channel transistor. Preferably, this punch-through implant is provided to a dosage of between $5 \times 10^{10}$ cm$^{-2}$ and $5 \times 10^{11}$ cm$^{-2}$ for long channel devices and between $1 \times 10^{11}$ cm$^{-2}$ and $1 \times 10^{12}$ cm$^{-2}$ for short channel devices, depending on the actual channel length of the device. Preferably, where both long and short channel transistors are to be fabricated on a common substrate, the punch-through implant is first performed to the extent appropriate for the long channel devices. A mask is then provided covering the long channel devices and the punch-through implant continued as appropriate and desired for the exposed short channel devices. Significantly, this fabrication difference is the only one required in conjunction with the present invention to provide for co-resident high speed, high density FETs and high voltage tolerant FETs.

The second ion implantation is performed at a low implant energy, preferably of between 20 and 40 KeV, so as to place p-type impurities just beneath the surface of the substrate in the N and P-channel transistor areas 15, 17. The dosage of this second ion implant is chosen to substantially define the threshold voltage of both of the eventual transistors, preferably at about 0.6 volts. Accordingly, boron impurities are preferably provided to a dosage of between $1 \times 10^{11}$ cm$^{-2}$ and $1 \times 10^{12}$ cm$^{-2}$, depending on the particular desired threshold voltage.

As may be observed from FIG. 5, conventional processing steps are then performed to provide gate oxide layers 74, 75 and gates 38', 40' respectively overlying the N and P-channel transistor areas 15, 17. Preferably the gate oxide layers 74, 75 are silicon dioxide having a thickness ranging between 150 and 500 angstroms. The thickness of gate oxide for each type of transistor (N or P) may be separately optimized in a conventional manner. The gates 38', 40' are preferably polycrystalline silicon having a thicknesses of about 5,500 angstroms.

A resist mask 85 is then provided over the N-channel transistor area 15. An ion implantation of p-type impurities 84 is then performed. The energy of the implant is limited so that, by the presence of the resist mask 85, gate/oxide structure 40', 75 and the exposed portions of the field oxide 16, the p-type impurities 84 are only implanted into the well region 14 through the exposed surface area of the P-channel transistor area 17. The resulting distributions of p-type implanted ions 86 are closely aligned with the edges of the gate/oxide structure 40', 75 and the edges of the field oxide 16. The implant, however, must be of sufficient energy to provide for the desired eventual junction depths of, preferably, between 0.2 and 0.8 micrometers. Generally, this ion implantation is performed at an energy within the range of 10 to 50 KeV to provide p-type impurities to a dosage of $5 \times 10^{13}$ cm$^{-2}$ to $1 \times 10^{15}$ cm$^{-2}$ and preferably at an energy within the range of 20 to 40 KeV, providing boron ions to a dosage ranging from $1 \times 10^{14}$ cm$^{-2}$ to $5 \times 10^{14}$ cm$^{-2}$ for an eventual junction depth of between 0.3 and 0.5 micrometers. Following the ion implantation, the resist mask 85 is striped away and a short annealing of the substrate structure 80 is performed to lightly drive in and anneal the implanted ions 86 to form the initial regions 90.

As indicated in FIG. 6, a blanket ion implant of n-type impurities 88 is then preferably performed. In accordance with the present invention, the implanted ions 88 are provided to provide a dosage preferably about one order of magnitude less than that of the annealed p-type regions 90. Thus, in accordance with the present invention, an additional masking step to block this counter doping is obviated. As before, the gate/oxide structures 38', 74, 40', 75 and the field oxide region 16 prevent the implantation of the ions 88 thereunder. That is, the ions implanted into the regions 90 act as only a light counter doping that do not significantly change their net impurity concentration. These ions are also implanted through the exposed surface area of the N-channel transistor surface 15 to form the implanted distributions 92 in alignment with the respective edges of the gate/oxide structure 38', 74 and the field oxide 16. Generally, the n-type impurities 88 are implanted at an energy within the range of 20 to 100 KeV, preferably to match the junction depth of regions 90, to a dosage of between $5 \times 10^{12}$ cm$^{-2}$ to $1 \times 10^{14}$ cm$^{-2}$ and, preferably, phosphorous ions are implanted at an energy of between 30 and 80 KeV to provide a dosage of about $1 \times 10^{13}$ cm$^{-2}$ to $5 \times 10^{13}$ cm$^{-2}$.

Next an oxide layer is provided over the surface of the substrate 12 to a thickness sufficient at least to cover the gate electrodes 38', 40'. Preferably, this oxide layer is provided by a conventional liquid phase chemical vapor deposition (LPCVD) of silicon dioxide to a thickness ranging between 4000 and 8000Å and preferably of about 6000Å. A reactive ion etching of the LPCVD oxide layer is then performed to remove most of the oxide layer. As shown in FIG. 7, oxide sidewall spacers 96, present adjacent the gate/oxide structures 38', 74 and 40', 75 remain while essentially all of the LPCVD oxide layer has been removed from the top of the gate electrodes 38', 40'. Also exposed are portions of the substrate surface overlying the ion implanted regions 90, 94; the latter regions 94 having been annealed substantially as the result of the thermal cycling through the oxide layer deposition and reactive ion etching steps. Significantly, in accordance with the present invention, the oxide sidewall spacers 96 extend over corresponding portions of the implanted regions 90, 94. The lateral extent of the oxide sidewall spacers 96 is generally dependent on the thickness of the gate/oxide structures 38', 74 and 40', 75 and the etch rate of the reactive ion etching. The reactive ion etching may be performed at oxide removal rates ranging between 300Å and 600Å per minute and preferably at a rate of between about 400Å and 500Å per minute. For the preferred ranges of gate electrode 38', 40' and gate oxide 74, 75 thicknesses, the oxide sidewall spacers preferably range between 0.3 and 0.7 micrometers, as measured between the edges of the gate electrodes 38', 40' and the nearest exposed edges of their respective N and P-channel transistor surface areas.

Following the reactive ion etching, an annealing and thin oxide growth step is then performed. The annealing and oxide growth step is performed at a low temperature, preferably in the range of 700 to 950 degrees centigrade, and in a dry oxygen ambient, so as to provide the thin oxide layer in a thickness range of 100 to 200Å over the entire surface of the substrate 12. As a consequence of the annealing, the implanted ion distributions 92 are stabilized within the substrate to form the lightly doped regions 94. The thin oxide layer itself is provided generally to protect the surface of substrate 12 from undesirable contamination during the subsequent processing steps. The thickness of the oxide layer, however, is insufficient to significantly effect the intended results of the subsequent fabrication steps.

A second resist mask 102 is then provided, as shown in FIG. 8, so as to cover the P-channel surface area 17. An ion implantation of n-type impurities 100 is then performed. By the presence of the resist mask 102, portions of the field oxide 16, the gate/oxide structure 38', 74 and the sidewall spacers 96, the n-type impurities 100 are implanted into a subportion of the n-type impurity region 94. Preferably, the implanted ions 98 are implanted at energies ranging between 25 and 50 KeV and at dosages ranging between $1 \times 10^{15}$ cm$^{-2}$ and $1 \times 10^{16}$ cm$^{-2}$ so as to provide process final conductivities generally corresponding with conventional source and drain regions.

The resist mask 102 is then stripped from the substrate 12 and an N-channel source and drain annealing cycle is performed. Consequently, source and drain regions 104 are formed in intimate contact with the remaining portions of the lighter doped regions 94. The implant energy is preferably chosen to have distributed the impurities 98 at depths that will yield source and drain region 104 junction depths substantially the same as the junction depths of the source and drain extension regions 94. It is contemplated that the use of greater or lesser implant energies and source and drain thermal anneal cycle times could be used to effectively encapsulate the source and drain 98 in the regions 94, or to allow the source and drain junctions to occur at depths greater than as initially established by the regions 94.

Figure 9:
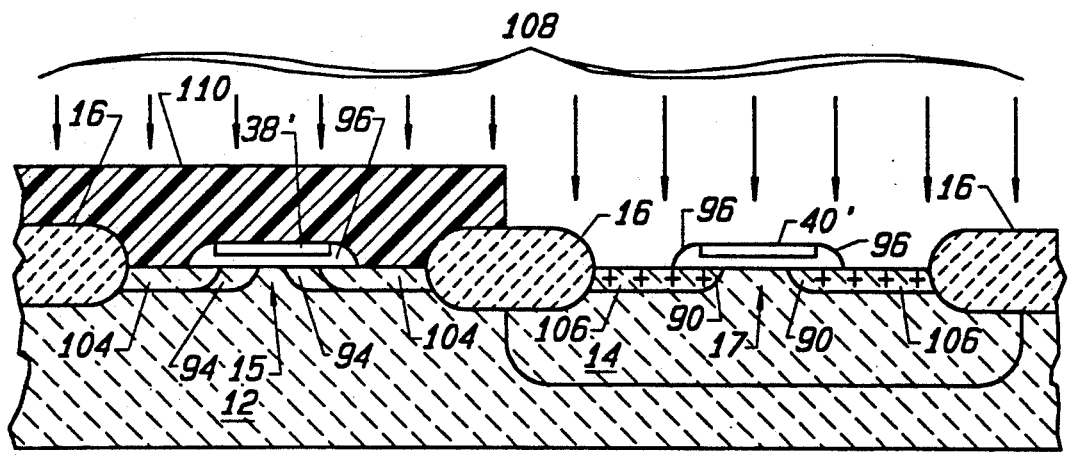

As shown in FIG. 9, the N-channel transistor area 15 is next covered by a resist mask 110 and another ion implantation is performed. The ions 108 are implanted through the essentially exposed surface area of the P-channel transistor area 17, as defined by the field oxide sections 16 and oxide sidewall spacers 96 adjacent the gate electrode 40'. Thus, the implanted ion distributions 106 are provided only in respective subportions of the source and drain lightly-doped regions 90. As before, the implanted ion distribution 106 are substantially aligned with the edges of the oxide sidewall spacers 96.

The p-type ions 108 are generally provided at energies ranging between 10 and 60 KeV and, preferably, $BF_2$ ions 108 are implanted at an energy within the range of about 25 to 50 KeV to a dosage of between about $1 \times 10^{15}$ and $1 \times 10^{16}$ cm$^{-2}$. The choice of $BF_2$ ions is preferred as readily providing the desired p-type impurities to a sufficient concentration generally matching that of conventional source and drain regions with junction depths appropriately shallow as to match the junction depth of the regions 90. The implanted ion distributions 106 are then annealed to form the final source and drain regions 108. The desired usage of a low temperature, short duration anneal for the source and drain regions 108 is to minimize any further diffusion the other implanted regions.

Figure 10:
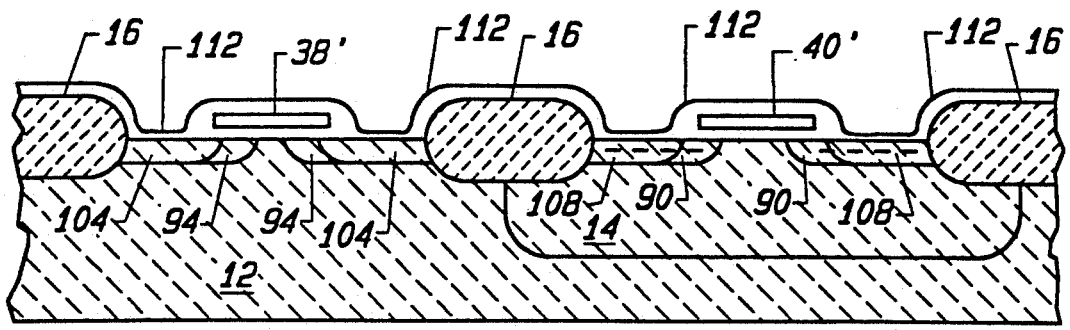
FIG. 10 provides a cross-sectional view of preferred complementary metal oxide semiconductor transistor cells fabricated in accordance with the present invention.

Finally, as shown in FIG. 10, a further oxide layer 112 may be provided over the surface of the substrate 12 as its initial oxide passivation layer. Additionally the layer 112 may serve as the oxide layer separating the control and isolated gate electrodes of an EEPROM device and to form the isolating layer for the first interconnecting metalization layer. The choice and utilization of such further processing steps are independent of the practice of the present invention.

EXAMPLES

Example 1

Short Channel, High Speed

An FET having a transistor geometry and fabricated in accordance with the present invention has been tested. The transistor was fabricated in a p-type silicon substrate having a background doping density of about $8 \times 10^{14}$ cm$^{-3}$ of a boron impurity. The P-channel transistor N-well region was formed to a depth of 3.5 micrometers beneath the substrate surface of the eventual channel region thereof. The well region was doped to a density of approximately $8 \times 10^{15}$ cm$^{-2}$ using a phosphorus impurity. Nitride masks were placed to define the active transistor regions, followed by a field oxide growth to a thickness of about 1300Å. After removal of the nitride, the punch-through and threshold adjusting ion implants were performed at energies of 110 and 32 KeV and dosages of $1 \times 10^{12}$ and $5 \times 10^{11}$ cm$^{-2}$, respectively, both using boron impurities. A gate oxide layer was then grown to a thickness of about 300Å. A polysilicon layer was deposited, masked and etched to form a gate electrode having a length of 1.5 micrometers and thickness of 5500Å. The corresponding length of the gate oxide layer was simultaneously defined. Lightly doped P-channel source and drain regions were then formed having junction depths of 0.4 micrometers by implantation of boron at 30 KeV and at a dosage of $2 \times 10^{14}$ cm$^{-2}$. This was followed by an anneal step of 900° C. for 30 minutes. The implantation of the lightly doped N-channel source and drain regions was then performed at an implant energy of 60 KeV providing a dosage of $3 \times 10^{13}$ cm$^{-2}$ using a phosphorus impurity. This resulted in lightly doped source and drain regions having a junction depth of 0.3 micrometers. As a result of the sequential oxide deposition, to a thickness of 6000Å, and reactive ion etching steps next performed, silicon dioxide sidewall spacers were formed having a lateral extent of 0.5 micrometers beyond the respective edges of the gate electrodes. The N-channel source and drain implant was then performed at an energy of 50 KeV to a dosage of $7 \times 10^{15}$ cm$^{-2}$ to provide n-type source and drain regions having junction depths closely matching that of the lightly doped n-type regions, but having a much higher doping density of as established after a drive-in at a temperature of 900° C. for a period of 2 hours, followed by a 10 minute wet ambient oxidation at 900° C. The p-type source and drain regions were implanted at an energy of 60 KeV at a dosage of $7 \times 10^{15}$ cm$^{-2}$ to again provide source and drain regions having junction depths closely matching that of the lightly doped p-type source and drain regions but having a much higher doping density. The final anneal was performed at a temperature of 900° C. for a period of 50 minutes.

The resulting transistor geometry yielded devices having a channel length of 1.5 micrometers. Operating potential differences of 13 volts $V_{DS}$ were readily supported without the onset of punch-through, gated diode breakdown or significant oxide charging. Further, the device exhibited standard gate switching characteristics including a switching delay estimated at about 280 pico seconds. Testing of the device indicated that about one order of magnitude less hot electrons were being generated than typical in comparable, conventional devices and, therefore, not being injected into the gate oxide. Further, the device exhibited no significant change in body factor over comparable conventional devices.

Example 2

Short Channel High Speed

Another transistor was fabricated in accordance with the present invention having a channel length of 1.25 micrometers. In all other significant aspects, the fabrication procedure was the same as used in Example 1. Operation at a potential difference of 7 volts $V_{DS}$ was readily supported without the onset of punch-through gate diode breakdown or significant gated oxide charging.

Example 3

Long Channel High Voltage

Another transistor was fabricated in accordance with the present invention having a channel length of 2.0 micrometers. At this channel length, the punch-through implant was performed only to a dosage of $2 \times 10^{11}$ cm$^{-2}$; the additional channel length contributing to the resistance of punch-through. In all other significant aspects, the fabrication procedure was the same as used in Example 1. Operation at a potential difference of 15 volts $V_{DS}$ was readily supported without the onset of punch-through, junction breakdown or significant gate oxide charging.

Example 4

Long Channel High Voltage

Another transistor was fabricated in accordance with the present invention having a channel length of 2.5 micrometers. In all other significant aspects, the fabrication procedure was the same as used in Example 3. Operation at a potential difference of 21 volts $V_{DS}$ was readily supported without the onset of punch-through, gated diode breakdown or significant gate oxide charging.

Thus, both a high speed, small cell geometry FET and a long channel FET sharing a common transistor geometry capable of operating from respective, relatively high operating potential differences, and an optimal process for their fabrication, have been described.

Clearly, many modifications and variations of the present invention are possible and contemplated in light of the above teachings. These modifications may include changes in the specific conductivity type of the substrate and regions formed therein, the specific impurities used, the impurity concentrations and the manner of their provision, and the processing times and temperatures employed throughout. Further, the specific details of conventional oxide growth, lithographic masking, oxide etching and removal steps have not been described in order not to obscure the present invention. It is therefore to be understood that, within the scope of the appended claims, the invention may be practiced otherwise than as specifically described above.

We claim:

1. A field effect transistor geometry, including a gate structure having a gate electrode and a gate oxide layer, suitable for realizing both high-speed and high-voltage transistors on a common monolithic substrate through simultaneous fabrication of said gate electrode and said oxide layer with minimal additional fabrication steps required, said transistor geometry comprising:
   a) a semiconductor substrate having a major surface, said substrate being of a first conductivity type;
   b) first and second regions disposed within said substrate, adjacent the major surface thereof, and having a junction depth of less than about 0.8 micrometers, said first and second regions being spaced apart from one another by a channel region, said channel region being in a first range of lengths of approximately 0.75 microns to 1.5 microns or a second range of lengths of approximately 1.5 microns to 3.0 microns, said first and second regions being of a second conductivity type and having a doping density greater than that of said channel region;
   c) third and fourth regions provided within said substrate and adjacent the major surface thereof, said third and fourth regions being of said second conductivity type, having a doping density greater than that of said first and second regions and having a junction depth substantially the same as that of said first and second regions, portions of said first and second regions being respectively associated with and interposed between said third and fourth regions such that the electric field at the substrate interface with said third and fourth regions is less than a predetermined intensity;
   d) a gate structure including a gate electrode and a gate oxide layer, said gate oxide layer provided adjacent said major surface of said substrate and overlying said channel region, said gate oxide layer having a thickness of less than about 300 Angstroms;
wherein said transistor geometry defines a transistor with said first range of channel lengths suitable for operation at a predetermined bias potential difference selected from any in the range of seven (7) to thirteen (13) volts, and a transistor with said second range of channel lengths suitable for operation at a predetermined bias potential difference selected from any in the range from thirteen (13) to twenty-one (21) volts.

2. The transistor geometry of claim 1 wherein said bias potential difference induces the formation of depletion regions respectively associated with said third and first and said fourth and second regions and wherein said first and second regions moderate the extension of said depletion regions toward one another and said channel region so as to prevent said depletion regions from otherwise overlapping.

3. The transistor of claim 2 wherein the doping densities of said first and second regions are sufficiently reduced with respect to said third and fourth regions to resist gated diode breakdown in excess of 15 volts.

4. The transistor of claim 3 wherein the respective doping densities of said first and second regions and said channel region are such to permit operation when said predetermined bias potential deference exceeds 7 volts between said third and fourth regions and the length of said channel is less than about 1.5 micrometers.

5. The transistor of claim 3 wherein the respective doping densities of said first and second regions and said channel regions are such to permit operation of said transistor when said predetermined bias potential difference exceeds 15 volts between said third and fourth regions and the length of said channel is less than about 2.5 micrometers.

6. A field effect transistor operable from a predetermined bias potential difference that forms an electric field of graded intensity having a maximum in said transistor, said transistor comprising:
   a) a substrate of a semiconductor material of a first conductivity type, said substrate having a major surface;
   b) a gate structure overlying said major surface, said gate structure including a gate electrode, defining a channel region within said substrate, and a gate oxide layer, said gate oxide layer provided adjacent said major surface and having a thickness of less than about 500 Angstroms;
   c) first and second primary regions provided at said major surface respectively spaced apart by an intervening portion of said substrate including said channel region, said primary regions being of a second conductivity type and having a first reverse breakdown voltage corresponding to the relative conductivities of said substrate and said primary regions, said first and second primary regions having a junction depth of less than about 0.8 micrometers; and
   d) first and second secondary regions provided respectively adjacent said first and second primary regions and defining said channel region thereinbetween, said secondary regions being of like conductivity type and lesser conductivity relative to said primary regions and having a second reverse breakdown voltage corresponding to the relative conductivities of said substrate and said secondary regions, said second reverse breakdown voltage being of greater magnitude than either said first reverse breakdown voltage or said bias potential, said first and second secondary regions being provided at said major surface and extending away therefrom for a depth greater than the corresponding dimension of said channel and a junction depth the same as that of said first and second primary regions;
wherein said predetermined bias potential is within a range of seven (7) to twenty-one (21) volts.

7. The field effect transistor of claim 6 wherein said channel region has a length, in line with said first and second primary and secondary regions, in the range of about 0.75 to 3.0 micrometers, said substrate is silicon having a background doping density of about $8 \times 10^{14}$ cm$^{-3}$, said first and second primary regions having a doping density in excess of about $1 \times 10^{20}$ cm$^{-3}$ and said first and second secondary regions having a doping density of about one to three orders of magnitude less than that of said first and second primary regions and wherein said first and second primary regions and said first and second secondary regions extend to a like depth below said major surface in a range of about 0.3 to 0.8 micrometers.

8. A semiconductor device including a plurality of field effect transistors, said device comprising:
  a) a semiconductor substrate having a major surface, said substrate being of a first conductivity type;
  b) a plurality of first regions respectively corresponding to said plurality of transistors, each of said first regions including a first subregions, said plurality of first regions being disposed within said substrate adjacent said major surface, said first region and first subregions having like junction depths less than about 0.8 micrometers, said plurality of first regions being of a second conductivity type, each of said first subregions having a doping density less than that of said first region;
  c) a plurality of second regions respectively corresponding to said plurality of first regions, said second regions including a second subregion, corresponding to said first region and first subregion, respectively, said second region being of said second conductivity type and disposed within said substrate and adjacent said major surface; and
  d) a plurality of channel regions respectively corresponding to said first and second regions, said channel regions being of said first conductivity type and disposed within said substrate and adjacent said major surface, said channel regions being arrayed with said first and second regions such that respective ones of said first subregions and said second subregions exclusively define the channel length of respective channel regions, a first subset of said channel regions having channel lengths less than about 1.5 micrometers and a second subset of said channel regions having channel lengths between about 1.5 and 3.0 micrometers; and
  e) a plurality of gate structures respectively overlying said channel regions, each said gate structure including a gate and a gate oxide layer adjacent said major surface, each said gate oxide layer having a like thickness of less than about 500 Angstroms;
wherein a first plurality of field effect transistors having said first subset of channel length are operable at a predetermined bias potential within a range of seven (7) to at least thirteen (13) volts and a second durality of field effect transistors having said second subset of channel lengths are operable at a predetermined bias potential within a range of thirteen (13) to at least twenty-one (21) volts.

9. The device of claim 8 wherein the depth to which said first subregions extend into said substrate is greater than that of said channel regions and wherein each said gate oxide layer has a like thickness of less than about 300 Angstroms.

10. The device of claim 9 wherein the doping density of said first subset of said channel regions is sufficiently high and the doping density of said first subregions is sufficiently reduced with respect to said first regions to preclude punch through upon application of a predetermined bias potential difference between said first and second regions in excess of 7 volts.

11. The device of claim 10 wherein the doping density of said first subregions is sufficiently reduced with respect to said first region to preclude gated diode breakdown at a predetermined bias potential difference applied between said first and second regions in excess of 15 volts.

12. An integrated circuit comprising:
  a) a substrate of a semiconductor material; and
  b) first and second MOS transistors, said first and second transistors each including:
    i) source and drain regions of a first predetermined doping density and a first predetermined conductivity type formed at a surface of said semiconductor substrate, said source and drain regions extending to a first predetermined depth below said surface, said first predetermined depth being less than about 0.8 micrometers;
    ii) source and drain extension regions of a second predetermined doping density and said first predetermined conductivity type formed adjacent said source and drain regions, respectively, at said surface of said semiconductor substrate, said source and drain extension regions extending to said first predetermined depth below said surface, said source and drain extension regions being formed spaced apart from one another at said surface to define a channel region having a length within a first predetermined channel length range for said first transistor and a second predetermined channel length range for said second transistor, said source and drain regions being separated from said channel region to said first predetermined depth by said source and drain extension regions;
    iii) a gate structure overlying said channel region and including a oxide layer adjacent said surface of said semiconductor substrate, said gate oxide layer having a thickness of less than about 300 Angstroms; and
said second predetermined doping density being from one to three orders of magnitude less than said first predetermined doping density, said first predetermined channel length range being less than about 1.5 micrometer and said second predetermined channel length range being greater than about 1.5 micrometer.

13. The integrated circuit of claim 12 wherein first predetermined channel length range is from about 0.75 to 1.5 micrometer and said second predetermined channel length range is from about 1.5 to 3.0 micrometer, wherein said channel region of said first transistor has a third predetermined doping density and said channel region of said second transistor has a fourth predetermined doping density, and wherein said third and fourth predetermined doping densities are selected in combination with said second predetermined doping density whereby said first and second transistors are mutually optimized for high-speed operation and high-voltage operation, respectively.

14. An integrated circuit including a plurality of MOS transistors of common transistor geometry, said circuit comprising:
  a) a semiconductor substrate having a major surface;
  b) a first MOS transistor including:
    i) first and second regions formed in said semiconductor substrate at and extending to a first predetermined depth below said major surface less than about 0.8 micrometers, said first and second regions being of a first conductivity type and having a first predetermined doping density; and ii) third and fourth regions formed in said semiconductor substrate at and extending to said first predetermined depth below said major surface, said third and fourth regions being of said first conductivity type and having a second predetermined doping density, said third and fourth regions being formed adjacent said first and second regions, respectively, said third and fourth regions being spaced apart from one another by a first channel region having a channel length with a first channel length range of about 0.75 to 1.5 micrometers, said third and fourth regions exclusively defining, to said first depth, said first channel region with respect to said first and second regions; and c) a second MOS transistor including:

i) fifth and sixth regions formed in said semiconductor substrate at and extending to said first predetermined depth below said major surface, said fifth and sixth regions being of said first conductivity type and having said first predetermined doping density; and ii) seventh and eighth regions formed in said semiconductor substrate at and extending to said first predetermined depth below said major surface, said seventh and eighth regions being of said first conductivity type and having said second predetermined doping density, said seventh and eighth regions being formed adjacent said fifth and sixth regions, respectively, said seventh and eighth regions being spaced apart from one another by a second channel region having a channel length within a second channel length range of about 1.5 to 3.0 micrometers, said seventh and eighth regions exclusively defining, to said first depth, said second channel regions with respect to said fifth and sixth regions, and said second predetermined doping density being one to three orders of magnitude less than that of said first predetermined doping density.

15. In an integrated circuit wherein a high-speed, short channel field effect device is provided along with a high-voltage, long channel field effect device at a surface of a semiconductor substrate, wherein said high-voltage, long channel field effect device includes first and second regions provided at said surface and a first channel region provided therebetween, wherein said high-speed, short channel, field effect device includes third and fourth regions provided at said surface and a second channel region provided thereinbetween and wherein a respective gate structure, each including a gate and a gate oxide layer, overlie said first and second channel regions, wherein the improvement comprises:

a) a first extension region provided between said first region and said first channel region, said first extension region having the same conductivity type as said first region;

b) a second extension region provided between said third region and said second channel region, said second extension region having the same conductivity type as said third region; and wherein said first, second third and fourth regions and said first and second extension regions are formed to a like junction depth below said surface less than about 0.8 micrometers, each said gate oxide layer is provided with a like thickness of less than about 500 Angstroms, and said first and second extension regions have a like doping density about one to three orders of magnitude less than that of said first and third regions.

16. The integrated circuit of claim 15 wherein said first and second channel regions have predetermined channel lengths greater than about 1.5 micrometers and less than about 1.5 micrometers, respectively, and have predetermined channel implant doping densities such that said high-speed, short channel field effect device and said high-voltage, long channel field effect device are optimized for high-speed and high-voltage operation, respectively.

17. The integrated circuit of claim 16 wherein said improvement further includes third and fourth extension regions provided at said surface between said second and fourth regions and said first and second channel regions, respectively, such that said second and fourth regions are separated from said first and second channel regions by said third and fourth extension regions, respectively, wherein said first, second, third and fourth regions have a like doping density and wherein said third and fourth extension regions have a like doping density about one to three orders of magnitude less than that of said first and third regions.

* * * * *